United States Patent
Blatchford et al.

(10) Patent No.: US 7,774,739 B2
(45) Date of Patent: Aug. 10, 2010

(54) METHODS FOR ADJUSTING SHIFTER WIDTH OF AN ALTERNATING PHASE SHIFTER HAVING VARIABLE WIDTH

(75) Inventors: James Walter Blatchford, Richardson, TX (US); Carl Albert Vickery, III, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 110 days.

(21) Appl. No.: 11/565,215

(22) Filed: Nov. 30, 2006

(65) Prior Publication Data

US 2008/0134128 A1 Jun. 5, 2008

(51) Int. Cl.
G06F 17/50 (2006.01)

(52) U.S. Cl. .................. 716/21; 716/19; 716/20; 430/5; 430/30

(58) Field of Classification Search ........... 716/19–21; 430/5, 30
See application file for complete search history.

(56) References Cited

U.S. PATENT DOCUMENTS

| | | | | |
|---|---|---|---|---|
| 5,862,058 A * | 1/1999 | Samuels et al. | ............... | 716/21 |
| 6,757,886 B2 * | 6/2004 | Liebmann et al. | ............. | 716/19 |
| 6,813,759 B2 * | 11/2004 | Liu et al. | ....................... | 716/21 |
| 7,132,203 B2 * | 11/2006 | Pierrat | ............................ | 430/5 |
| 7,332,250 B2 * | 2/2008 | Misaka | .......................... | 430/5 |
| 7,399,557 B2 * | 7/2008 | Kanai | ............................. | 430/5 |
| 7,459,243 B2 * | 12/2008 | Sasaki | ............................ | 430/5 |
| 2004/0096752 A1 * | 5/2004 | Liebmann et al. | ............. | 430/5 |

* cited by examiner

Primary Examiner—Nghia M Doan
(74) Attorney, Agent, or Firm—Wade J. Brady, III; Frederick J. Telecky, Jr.

(57) ABSTRACT

In accordance with an embodiment of the invention, there is a method of designing a lithography mask. The method can comprise determining a maximum width of a shifter, wherein the maximum width corresponds to a width of a shifter for a first set of features and determining whether the shifter having the maximum width can be placed in a shifter space for a second set of features. The method can also comprise incrementally decreasing the width of the shifter to be placed into the shifter space for the second set of features when the shifter having the maximum width cannot be placed in the shifter space for a feature in the second set of features until an acceptable shifter width can be determined or until the shifter width is reduced to a predetermined minimum shifter width.

11 Claims, 6 Drawing Sheets

METHODS FOR ADJUSTING SHIFTER WIDTH OF AN ALTERNATING PHASE SHIFTER HAVING VARIABLE WIDTH

FIELD OF THE INVENTION

This invention relates generally to the field of integrated circuits and more specifically to a method and system for using alternating phase-shift implementation in lithographic processes.

BACKGROUND OF THE INVENTION

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc) has been built up around this technology.

In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and images the circuit pattern, typically with a 4× to 5× reduction factor, on a photoresist film formed on a silicon wafer. The term "chrome" refers to an opaque masking material that is typically but not always comprised of chrome. The transmission of the opaque material may also vary such as in the case of an attenuating phase shift mask.

As the semiconductor industry continues to evolve, feature sizes of the pattern are driven to smaller resolution. To meet this demand, Resolution-Enhanced optical lithography Technologies ("RET") have become popular as techniques for providing patterns with sub-wavelength resolution. These methods include off-axis illumination ("OAI"), optical proximity correction ("OPC"), and phase-shift masks ("PSMs"). Such resolution-enhanced optical lithography methods are especially useful for generating physical devices on a wafer that require small size and tight design tolerance. Examples of such physical devices are the gate length of a transistor or the dimensions of contact cuts formed in inter-layer dielectrics.

One of the most common commercial implementations of phase shift mask technology is the double exposure method. A first mask, often called a binary mask, contains most of the features at the gate level. The binary mask can be printed using standard lithography techniques. A second mask, often called an alternating phase-shift mask (altPSM) includes the critical, or small sized features at the gate level.

An example of a double exposure phase shift method is illustrated in FIGS. 1A and 1B. FIG. 1A shows a layout of the mask features including the binary gate mask and phase shift features needed for each phase shift printed transistor. FIG. 1A shows a layout 100 of the overlay of a binary photomask and an altPSM over active areas 102. The binary photomask includes a series of binary gate layouts 112. The altPSM includes the phase shifters (also called shifters) 122*a* and 122*b*, where phase shifters 122*a* have a 0° phase shift and phase shifters 122*b* have a 180° phase shift. In use, a photoresist is applied to a wafer and the wafer is exposed to both masks in succession followed by photoresist development. The final transistors 132 and 134 formed using the two masks shown in FIG. 1A are shown in FIG. 1B.

At least one phase shifter is placed on a side of a feature that is to be reduced in size. In FIG. 1A, shifters 122*a* and 122*b* are placed on both sides of gate layouts 112. The features that are to be reduced in size are often placed next to other features, which themselves are to be reduced in size. As such, there is a limited amount of space in which to place the shifters. In FIG. 1A, for example, shifter 122*b* is placed in the space D1. In this case, the shifter 122*b* has a width D2 sufficiently less than the size of the space D1 and can be placed into the allotted space.

Problems arise, however, when designing an altPSM used to produce regions of a layouts having dense features and isolated features, such as arrays of transistors in random logic designs and where features are perpendicular to each other. For example, the width of phase shifters for isolated lines must be optimized to give maximum process margin. The optimal solution often produces shifter widths that are large in comparison to the spaces in the layout in which they must fit. Conventional layouts, however, use the same size default shifter for each feature to be reduced in size. The conventional methods are incapable of varying the shifter size so the shifter cannot be optimized to fit in the allotted space. As a result, problems arise, some of which are illustrated in FIGS. 2A-2C.

For example, in FIG. 2A gate layout 212*a* is spaced at the same distance from gate layout 212*b* as gate layout 212*c* is spaced from gate layout 212*d* and gate layout 212*b* is spaced a distance D2 from gate layout 212C, where D1 is different than D2. A space having width D3 is allotted for shifters on the sides of gate layout 212*a* and gate layout 212*b* that face each other and the space D3 is also allotted for shifters on the sides of gate layout 212*c* and gate layout 212*d* that face each other. The space having width D4 is allotted for shifters in the space having distance D2 on the sides of gate layout 212*b* and gate layout 212*c* that face each other. The space D1 is different from the space D2 because gate layout 212*b* is separated from gate layout 212*c* by a different amount than gate layout 212*a* is separated from gate layout 212*b*. As mentioned, conventional methods are only capable of using the same shifter width, shown here as width D5, for all situations. Thus, shifters 222*a* and 222*b* that have the same width D5 are used in each space D4 and D3, respectively. Because gate layouts 212*a* and 212*b* and gate layouts 212*c* and 212*d* are spaced close together, the shifters having width D5 fill almost all of the allowable space D3, which causes the gate features to print incorrectly. Similarly, gate layout 212*b* is spaced far from gate layout 212*c*. The shifters having width D5 do not provide an appropriate amount of coverage, which also causes the gate features to print incorrectly.

As shown in FIG. 2B, trying to fit the shifters of width D6 into a space of width D7 causes the shifters to merge into a single shifter. While in some cases merged shifters may be acceptable, in many cases, merged shifters cannot be used as they incorrectly trim the printed features or fail to reproduce an intended feature on a substrate. FIG. 2C depicts another example of a case where merged shifters are unacceptable. In FIG. 2C, gate layout 212 is perpendicular to gate layout 216 and the shifters 222*a*, 222*b*, 226*a*, and 226*b*, which are the same standard size, overlap. In this case, the merged shifters cause the gate features to print incorrectly.

Accordingly, the present invention solves these and other problems of the prior art to provide a method that can design layouts having maximum and/or variable shifter widths to allow altPSM implementation for dense or existing layouts.

SUMMARY OF THE INVENTION

In accordance with an embodiment of the invention, there is a method of designing a lithography mask. The method can comprise determining a maximum width of a shifter, wherein the maximum width corresponds to a width of a shifter for a first set of features and determining whether the shifter having the maximum width can be placed in a shifter space for a second set of features. The method can also comprise incrementally decreasing the width of the shifter to be placed into the shifter space for the second set of features when the shifter having the maximum width cannot be placed in the shifter space for a feature in the second set of features until an acceptable shifter width can be determined or until the shifter width is reduced to a predetermined minimum shifter width.

In accordance with another embodiment of the invention, there is a method of designing a lithography mask. The method can comprise determining a first shifter width based on a shifter space associated with a critical dimension feature and attempting to place a shifter having the first shifter width in a shifter space other than the shifter space associated with the critical dimension feature. The method can also comprise reducing a width of a shifter having the first shifter width when the width of the shifter having the first shifter width is larger than an allowed shifter width until the width of the shifter is allowed or until the width of the shifter is less than a minimum shifter width.

In accordance with another embodiment of the invention, there is a computer readable medium comprising program code that configures a processor to perform a method of correcting a lithography mask. The computer readable medium can comprise program code for determining a maximum width of a shifter, wherein the maximum width corresponds to a width of a shifter for a first set of features and program code for determining whether the shifter having the maximum width can be placed in a shifter space for a second set of features. The computer readable medium can also comprise program code for incrementally decreasing the width of the shifter to be placed into the shifter space for the second set of features when the shifter having the maximum width cannot be placed in the shifter space for a feature in the second set of features until an acceptable shifter width can be determined or until the shifter width is reduced to a predetermined minimum shifter width.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Embodiments of the present invention and its advantages are best understood by referring to FIGS. 3 to 6 of the drawings, like numerals being used for like and corresponding parts of the various drawings.

Figure 1A:
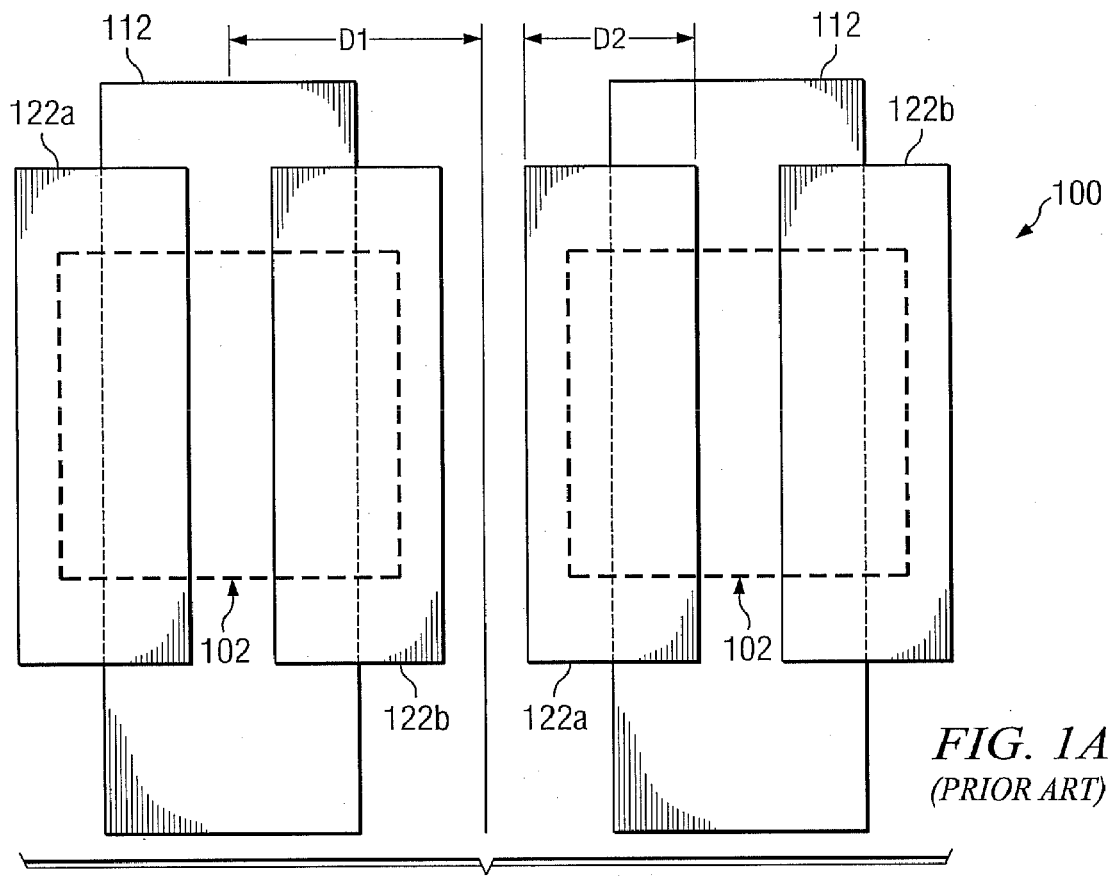
FIG. 1A is a diagram illustrating a layout of an overlay of a binary photomask and an alternating phase shift photomask.
Figure 1B:
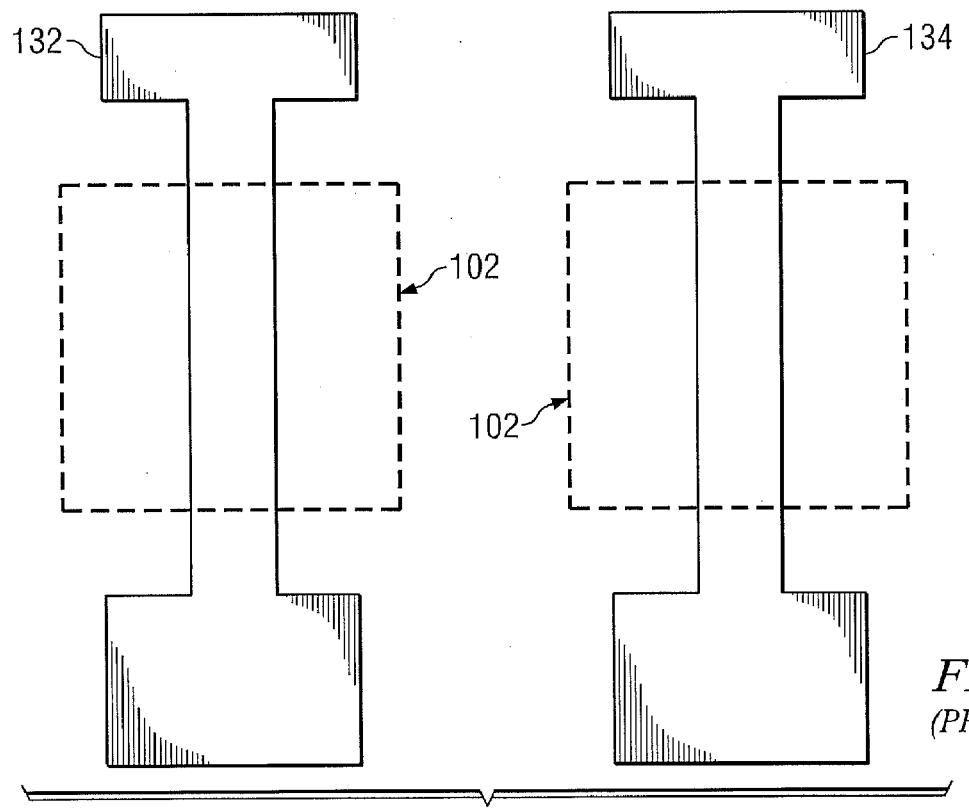
FIG. 1B. is a diagram illustrating a the final structures formed using the layout shown in FIG. 1A.
Figure 2A:
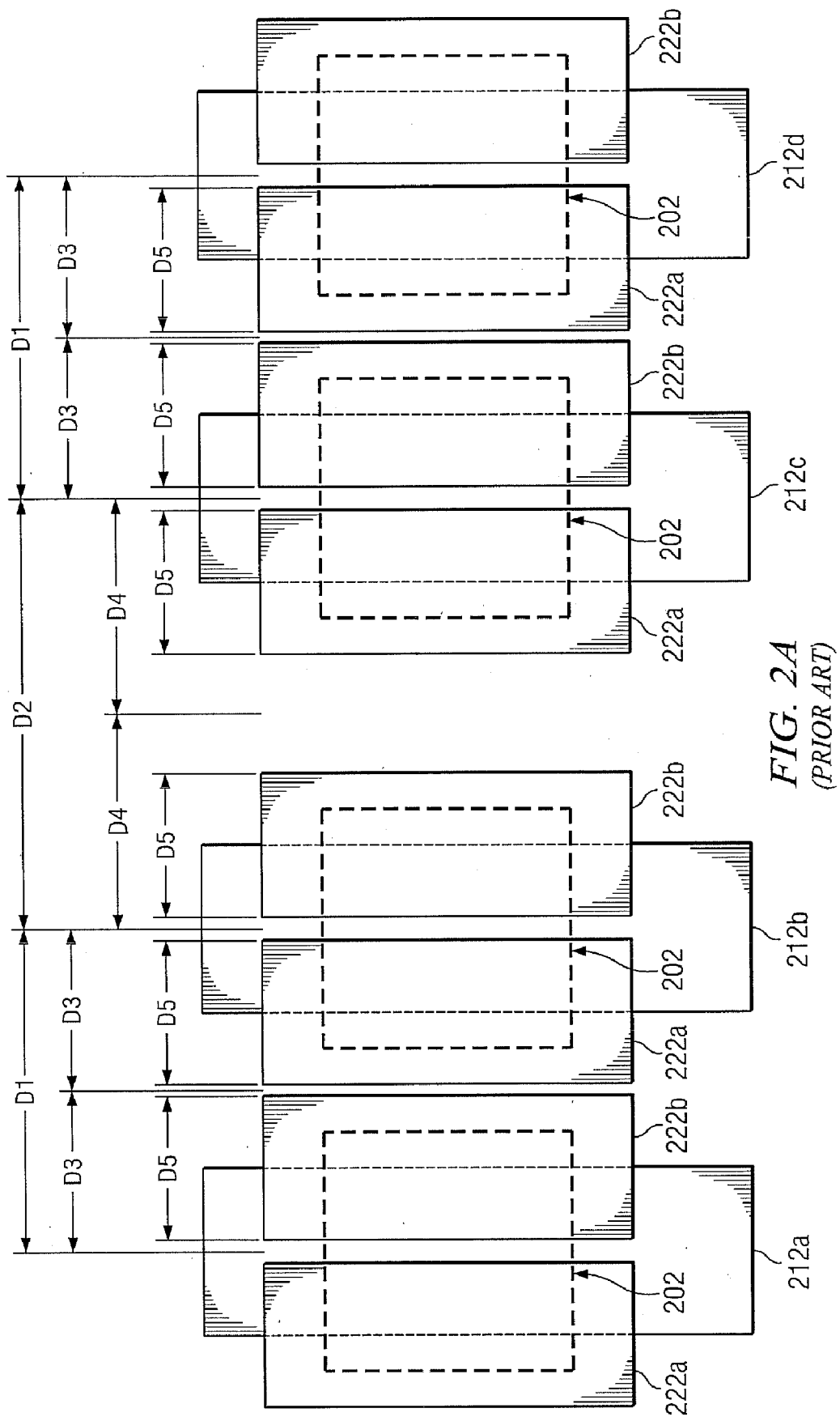
FIG. 2A is a diagram illustrating a conventional layout of an overlay of a binary photomask and an alternating phase shift photomask.
Figure 2B:
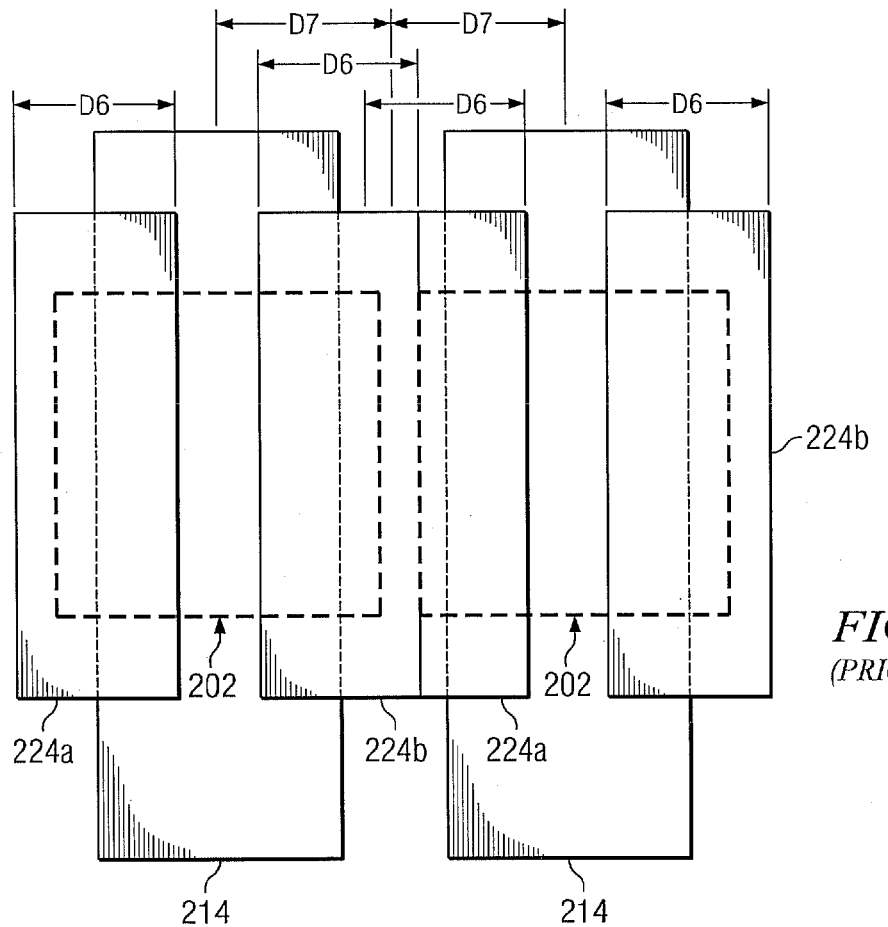
FIG. 2B is another diagram illustrating a conventional layout of an overlay of a binary photomask and an alternating phase shift photomask.
Figure 2C:
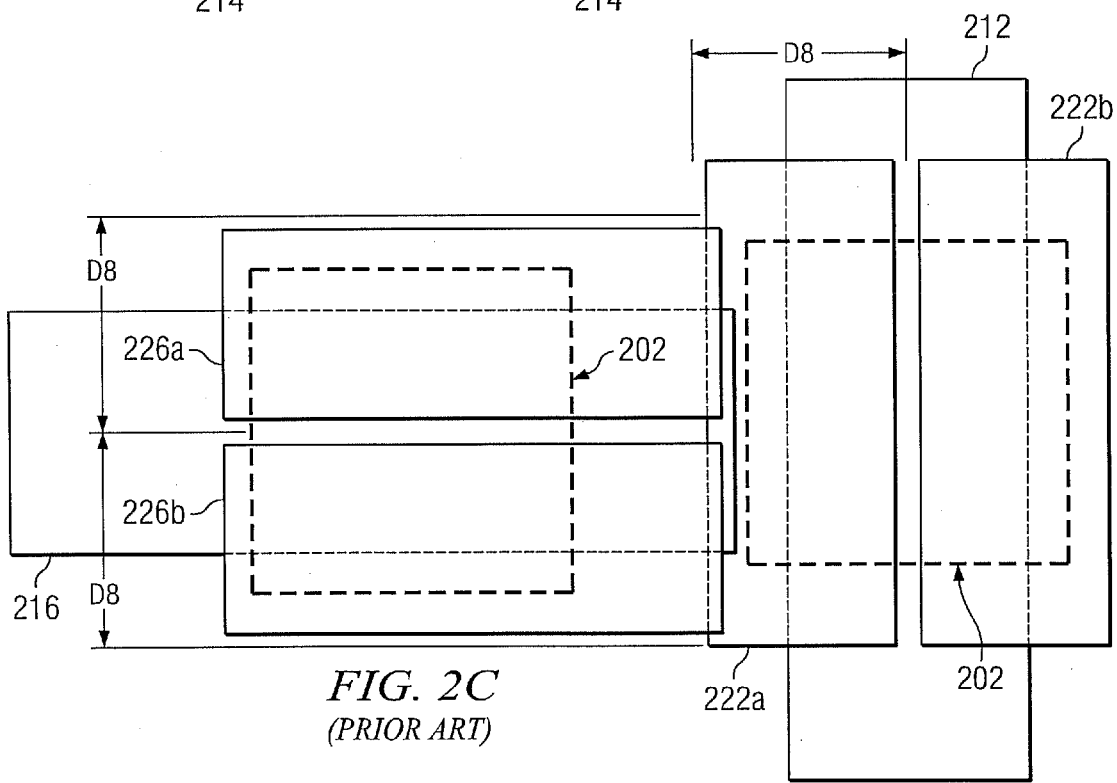
FIG. 2C is another diagram illustrating a conventional layout of an overlay of a binary photomask and an alternating phase shift photomask.
Figure 3:
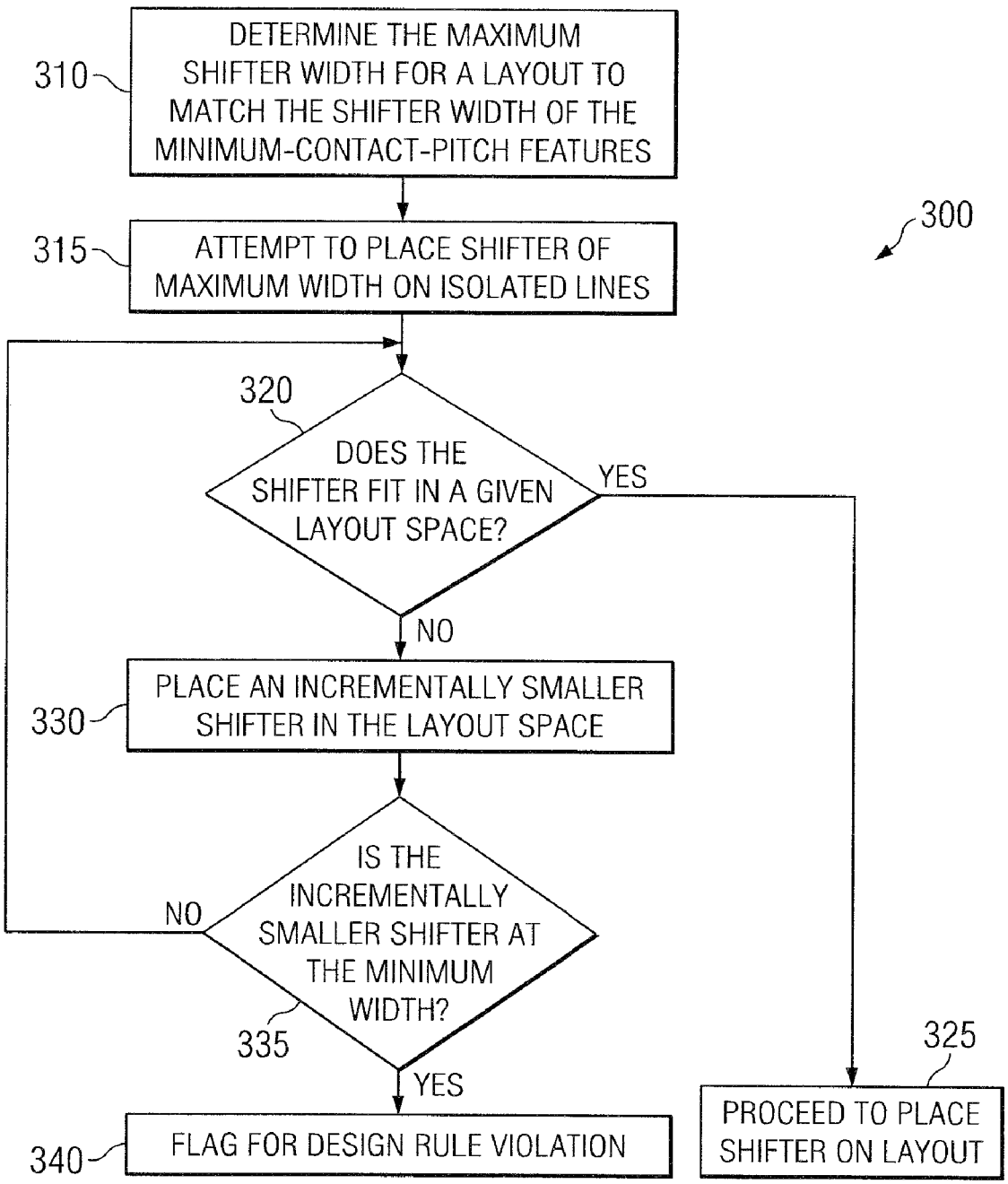
FIG. 3 is a flowchart illustrating one embodiment of a method that can design layouts having maximum and/or variable shifter widths to allow altPSM implementation for dense or existing layouts.

FIG. 3 shows a flowchart 300 illustrating various embodiments of a method for placing shifters on a layout. As used herein, the term "shifters" is used interchangeably with the term "phase shifter" and refers to the regions of the photomasks designed to produce destructive interference and produce a high-contrast pattern. At 310, the method determines a maximum size that a shifter can have and still be acceptable for use in the shifter space associated with a critical dimension (CD) feature, such as minimum-contact-pitch. The size can be, for example, width and/or length. The maximum target shifter width is determined so as to minimize sensitivity of the printed feature to other imaging parameters; e.g., scanner defocus and flare and trim-to-phase misalignment. For a 193-nm exposure tool, this width is typically 180-250 nm. At 315, the method attempts to place a shifter having the maximum width in a shifter space associated with another feature of the layout, such as an isolated line. For example, at 320 the method determines whether the maximum width shifter can fit into the shifter space without causing a problem, such as a design rule violation. If the width of the shifter is acceptable, the method places the shifter in the layout, as shown at 325. If the width of the shifter is too large, the method reduces the width, and possibly other dimensions, to allow the shifter to fit acceptably into the allotted space, as shown at 330. According to various embodiments, the method can attempt to automatically place an incrementally smaller width shifter into the allotted space. For example, in a typical embodiment, the shifter width is reduced by 10 nm per iteration. At 335, the method analyzes whether the incrementally smaller shifter width is smaller than a minimum width that can be tolerated by the lithography system. This minimum width can be predetermined by a user or by the process tools. For 193-nm exposure, this width is typically 110-150 nm. If the incrementally smaller shifter width is not smaller than the minimum width, the method can go back to step 320 to again determine whether the incrementally smaller width shifter can fit into the shifter space without causing a problem. If it is determined that the shifter is smaller than the minimum width, the shifter space and/or the shifter is flagged for attention, as shown at 340. For example, the method can mark or flag the shifter space and/or shifter as being a design rule violation.

Figure 4:
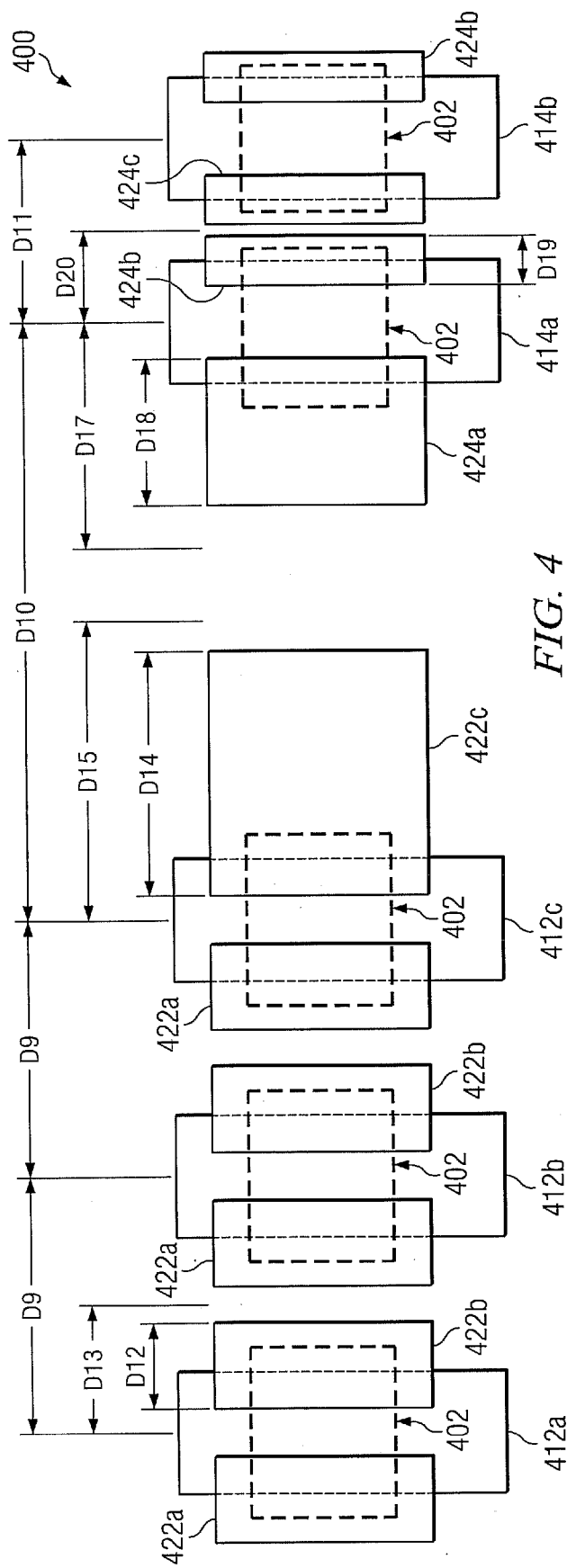
FIG. 4 is a diagram illustrating a layout of an overlay of a photomask and an alternating phase shift photomask in accordance with the present teachings.

FIG. 4 illustrates a layout 400 of the overlay of a binary photomask and an altPSM over active areas 402. The binary photomask includes a series of binary gate layouts 412a-c and 414a-b. The altPSM includes the shifters 422a, 422b, 422c, 424a, 424b, and 424c, where phase shifters 422a and 424a have a 0° phase shift and phase shifters 422b, 422c, and 424b have a 180° phase shift. In use, a photoresist is applied to a wafer and the wafer is exposed to both masks in succession followed by photoresist development. The gate layouts 412a-c are separated from each other at the same spacing, D9, and gate layout 414a is spaced from gate layout 412c by a space D10, and gate layout 414a is spaced from gate layout 414b by a space D11, where D11 is different than D10 and D9, and D10 is different than D9.

Using the teachings described herein, shifters having different sizes can be positioned in the allotted spaces. For example, shifters having a width of D12 can be used in the allocated space D13 between the gate layouts 412a and 412b and between the gate layouts 412b and 412c. These shifters can be the same size, D12. In contrast, a shifter having a width of D14 can be used in the allocated space having width D15 and a shifter of width D18 can be used in the allocated space having D17 between the gate layouts 412c and 414a. Also, a shifter having a width of D19 can be used in the space having width D20 between the gate layouts 414a and 414b. As can be seen, the method described herein can vary the size of the shifters to provide improved processing.

Figure 5A:
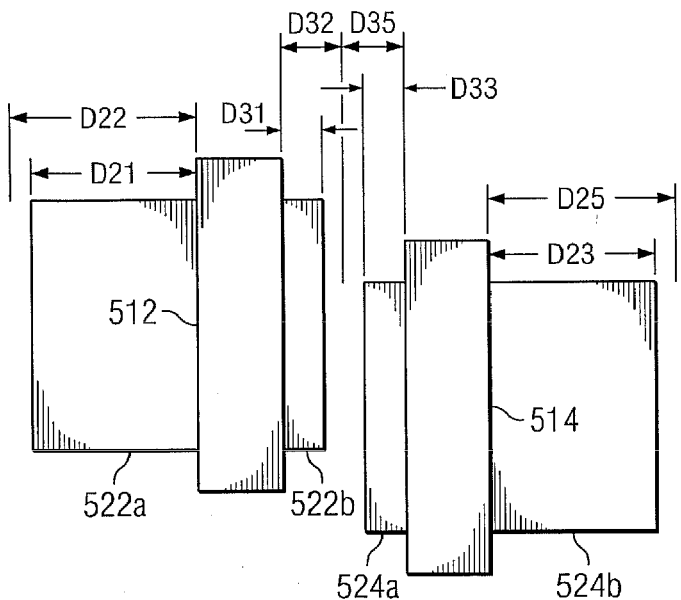
FIG. 5A is a diagram illustrating a layout that cannot be merged.
Figure 5B:
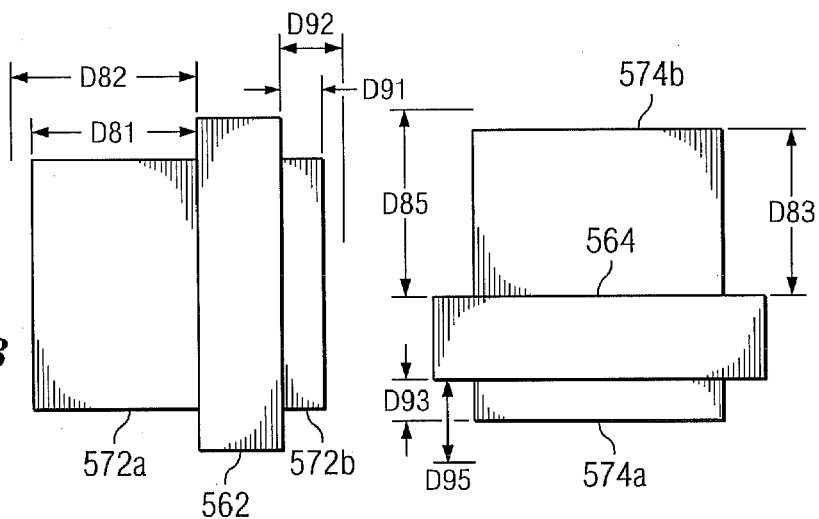
FIG. 5B is a diagram illustrating another layout that cannot be merged.

FIGS. 5A and 5B illustrate instances where layouts 500 and 550, respectively, cannot be merged. For example, FIG. 5A shows gate layouts 512 and 514. The altPSM includes the shifters 522a, 522b, 524a, and 524b, where phase shifters 522a and 524a have a 0° phase shift and phase shifters 522b and 524b have a 180° phase shift. Similarly, FIG. 5B shows gate layouts 562 and 564. The altPSM includes the shifters 572a, 572b, 574a, and 574b, where phase shifters 572a and 574a have a 0° phase shift and phase shifters 572b and 574b have a 180° phase shift. In use, a photoresist is applied to a wafer and the wafer is exposed to both masks in succession followed by photoresist development. In FIG. 5A, the gate layouts 512 is shown parallel to gate layout 514 and gate layout 562 is perpendicular to gate layout 514.

As described, using the teachings described herein, shifters having different sizes can be positioned in the allotted spaces. For example, in FIG. 5A shifter 522a can have a width of D21 and can be positioned in a space having a width of D22 and shifter 524b can have a width of D23 and can be positioned in a space having a width D25. Similarly, shifter 522b can have a width of D31 and can be positioned in a spacing having a width D32 and shifter 524a can have a width of D33 and can be positioned in a spacing having a width D35.

In FIG. 5B, shifter 572a can have a width of D81 and can be positioned in a space having a width D82 and shifter 574b can have a width of D83 and can be positioned in a space having a width D85. Similarly, shifter 572b can have a width of D91 and can be positioned in a spacing having a width D92 and shifter 574a can have a width of D93 and can be positioned in a spacing having a width D95.

Because the present teachings permit shifters of various sizes, the shifters can be positioned in the allotted spaces without forming merged shifters. Further, the shifters are optimized to the space and phase shift required to produce accurate features on a substrate.

Figure 6:
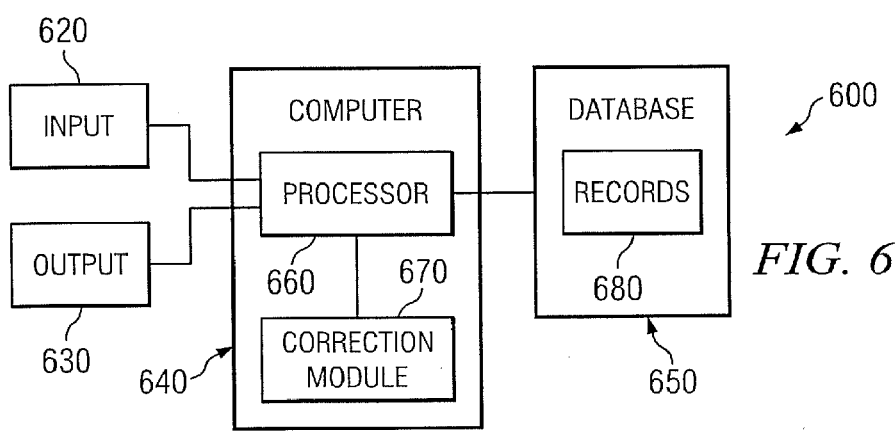
FIG. 6 illustrates a system for designing and correcting a photomask according to the present teachings.

FIG. 6 illustrates a system 600 that can be used to designing and correcting a mask pattern, such as a pattern on a phase photomask and/or a trim photomask described herein. System 600 includes an input device 620 and an output device 630 coupled to a computer 640, which is in turn coupled to a database 650. Input device 620 may comprise, for example, a keyboard, a mouse, or any other device suitable for transmitting data to computer 640. Output device 630 may comprise, for example, a display, a printer, or any other device suitable for outputting data received from computer 640.

Computer 640 may comprise a personal computer, workstation, network computer, wireless computer, or one or more microprocessors within these or other devices, or any other suitable processing device. Computer 640 may include a processor 660 and a correction module 670. Processor 660 controls the flow of data between input device 620, output device 630, database 650, and correction module 670. Correction module 670 may receive descriptions of a contour and an uncorrected pattern and can compute a corrected pattern that may be used to define the contour.

Database 650 may comprise any suitable system for storing data. Database 650 may store records 680 that include data associated with the layouts. A record 680 may be associated with a segment of the layout.

While the examples given have been with respect to patterning transistor gates over diffusion regions, the methods and systems described herein may also be used to correct patterns of other layers of integrated circuits. For example, the interconnect parts of a metal pattern may be divided into base and relational segments for improved critical dimension correction, leaving the corners and contact/via pads to be corrected as traditional placement-correction segments.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of designing a lithography mask on a semiconductor substrate, the method comprising:

determining, by a computer, a maximum shifter width for a shifter space associated with a first set of critical dimension features on the substrate;

setting a width of a shifter to be placed in a second set of features to the maximum shifter width, the second set of features being different from the first set of critical dimension features on the substrate; and if the shifter set to the maximum shifter width does not fit in a second shifter space associated with the second set of features, iteratively decreasing, by a preset increment, the width of the shifter to be placed into the second shifter space until the shifter fits in the second shifter space or until the shifter width is reduced to become equal to or less than a predetermined minimum shifter width; and flagging as a design rule violation the second shifter space for which the shifter can not fit after iteratively decreasing the width of the shifter.

2. The method of designing a lithography mask according to claim 1, wherein the first set of critical dimension features are contact-pitch features.

3. The method of designing a lithography mask according to claim 2, wherein the second set of features are isolated lines.

4. The method of designing a lithography mask according to claim 1, wherein at least two of the features in the second set of features are perpendicular to each other.

5. The method of designing a lithography mask according to claim 1, wherein the shifters do not merge to form a single shifter.

6. A semiconductor device made according to a method of designing a lithography mask on a semiconductor substrate, the method comprising:

determining, by a computer, a maximum shifter width for a shifter space associated with a first set of critical dimension features on the substrate;

setting a width of a shifter to be placed in a second set of features to the maximum shifter width on the substrate, the second set of features being different from the first set of critical dimension features;

if the shifter set to the maximum shifter width does not fit in a second shifter space associated with the second set of features, iteratively decreasing, by a preset increment, the width of the shifter to be placed into the second shifter space until the shifter fits in the second shifter space or until the shifter width is reduced to become equal to or less than a predetermined minimum shifter width; and flagging as a design rule violation the second shifter space for which the shifter can not fit after iteratively decreasing the width of the shifter.

7. A computer readable medium comprising program code that configures a processor to perform a method of correcting a lithography mask comprising:

program code for determining, by a computer, a maximum shifter width for a shifter space associated with a first set of critical dimension features;

program code for setting a width of a shifter to be placed in a second set of features to the maximum shifter width, the second set of features being different from the first set of critical dimension features;

program code if the shifter set to the maximum shifter width does not fit in a second shifter space associated with the second set of features, for iteratively decreasing, by a preset increment, the width of the shifter to be placed into the second shifter space until the shifter fits in the second shifter space or until the shifter width is reduced to become equal to or less than a predetermined minimum shifter width; and flagging as a design rule violation the second shifter space for which the shifter can not fit after iteratively decreasing the width of the shifter.

8. The computer readable medium comprising program code according to claim 7, wherein the first set of critical dimension features are contact-pitch features.

9. The computer readable medium comprising program code according to claim 7, wherein the second set of features are isolated lines.

10. The computer readable medium comprising program code according to claim 7, wherein at least two of the features in the second set of features are perpendicular to each other.

11. The computer readable medium comprising program code according to claim 7, wherein the shifters do not merge to form a single shifter.

* * * * *